United States Patent
Yoshida et al.

(10) Patent No.: US 9,455,171 B2
(45) Date of Patent: Sep. 27, 2016

(54) END EFFECTOR

(71) Applicant: KAWASAKI JUKOGYO KABUSHIKI KAISHA, Kobe-shi, Hyogo (JP)

(72) Inventors: Tetsuya Yoshida, Kobe (JP); Takeshi Shibata, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 14/758,362

(22) PCT Filed: Dec. 25, 2013

(86) PCT No.: PCT/JP2013/007581
§ 371 (c)(1),
(2) Date: Jun. 29, 2015

(87) PCT Pub. No.: WO2014/103299
PCT Pub. Date: Jul. 3, 2014

(65) Prior Publication Data
US 2016/0111312 A1    Apr. 21, 2016

(30) Foreign Application Priority Data
Dec. 28, 2012 (JP) ................. 2012-286697

(51) Int. Cl.
*B66F 19/00* (2006.01)
*H01L 21/68* (2006.01)
*H01L 21/67* (2006.01)
*B25J 15/00* (2006.01)
*H01L 21/687* (2006.01)

(52) U.S. Cl.
CPC .......... *H01L 21/681* (2013.01); *B25J 15/0014* (2013.01); *H01L 21/67259* (2013.01); *H01L 21/67265* (2013.01); *H01L 21/68707* (2013.01)

(58) Field of Classification Search
CPC .......... B25J 13/08; B25J 19/04; B25J 19/02; B25J 15/08; B25J 13/084; B25J 13/086; B25J 15/0009; B25J 9/1005; B25J 13/081; B25J 15/10; B25J 15/04; B25J 15/103; B25J 15/0014; G01V 11/00; G01L 5/226; G01L 5/228; Y10S 294/907; F16P 3/14; H01L 21/68707; H01L 21/67769; H01L 21/681; H01L 21/67265; H01L 21/67259
USPC ....................................... 294/213
See application file for complete search history.

(56) References Cited

U.S. PATENT DOCUMENTS

| | | | |
|---|---|---|---|
| 5,376,785 A * | 12/1994 | Chin | G01D 5/30 250/214 PR |
| 6,468,022 B1 * | 10/2002 | Whitcomb | H01L 21/67796 414/757 |
| 8,146,973 B2 * | 4/2012 | Roberts | H01L 21/67259 294/213 |
| 8,622,451 B2 * | 1/2014 | Mantz | H01L 21/68707 294/103.1 |
| 9,120,233 B2 * | 9/2015 | Moore | B25J 13/08 |
| 2012/0101633 A1 | 4/2012 | Rodnick | |

FOREIGN PATENT DOCUMENTS

| | | |
|---|---|---|
| JP | H07-22493 A | 1/1995 |
| JP | H08-83833 A | 3/1996 |
| JP | 2000-124289 A | 4/2000 |
| JP | 2010-219209 A | 9/2010 |

OTHER PUBLICATIONS

Mar. 18, 2014 Search Report issued in International Patent Application No. PCT/JP2013/007581.
Jul. 12, 2016 Search Report issued in European Patent Application No. 13868219.0.

* cited by examiner

*Primary Examiner* — Stephen Vu
(74) *Attorney, Agent, or Firm* — Oliff PLC

(57) ABSTRACT

An end effector includes: a hand; a substrate holder provided on the hand; a mapping detector provided at distal end portions of the hand; a light emitter, which the hand is provided with and which is configured to generate detection light; a light receiver, which the hand is provided with and which is configured to receive the detection light and convert the detection light into an electrical output; and an optical path formed such that the detection light emitted from the light emitter passes through the optical path to be incident on the light receiver; the optical path is formed such that detection light is blocked by a substrate detected in a cassette by the mapping detector, and such that detection light is blocked by a substrate held by the substrate holder.

4 Claims, 9 Drawing Sheets

END EFFECTOR

TECHNICAL FIELD

The present invention relates to an end effector included in a substrate conveying robot for holding and conveying a substrate.

BACKGROUND ART

In a semiconductor manufacturing apparatus, liquid crystal panel manufacturing apparatus, or the like, a substrate conveying robot is used to convey a substrate, such as a semiconductor wafer or a glass substrate, to a desired position precisely while keeping the substrate clean. The substrate conveying robot includes an end effector, which is a suction hand, for example. By means of the suction hand, the substrate conveying robot retrieves a substrate from a cassette in which substrates are stored in a multi-staged manner, and then conveys the substrate while holding the substrate on the hand.

Conventionally, detection of the presence or absence of a substrate in a cassette has been performed by using an optical sensor provided on the distal end of a hand of a robot (see Patent Literature 1, for example). In recent years, a substrate conveying robot capable of quickly detecting the presence or absence of a substrate in a cassette has been disclosed (see Patent Literature 2, for example). The substrate conveying robot includes a hand provided with two different types of optical sensors. A first sensor is installed such that its optical axis is horizontal, and a second sensor is installed such that its optical axis is inclined by a certain angle relative to the horizontal direction.

In the case of a conventional suction end effector, the end effector may not be able to sufficiently suck and hold a substrate if the substrate is bent. If the substrate is conveyed in such a state, there is a risk of the substrate falling from the end effector. Therefore, it is necessary to check whether the sucking and holding of the substrate are sufficient and whether the substrate is stably placed on the end effector.

In this respect, for example, based on information from a pressure switch provided on the hand, the conventional substrate conveying robot determines whether or not a substrate on the hand is bent, thereby detecting whether or not the substrate is properly sucked and held. Patent Literature 3 discloses a conveying robot configured to detect, by means of a transmissive optical sensor provided on a hand, whether or not a substrate has been properly held.

CITATION LIST

Patent Literature

PTL 1: Japanese Laid-Open Patent Application Publication No. H08-83833
PTL 2: Japanese Laid-Open Patent Application Publication No. 2010-219209
PTL 3: Japanese Laid-Open Patent Application Publication No. H07-22493

SUMMARY OF INVENTION

Technical Problem

However, the above-described conventional substrate conveying robots are unable to perform both the detection of the presence or absence of a substrate in a cassette and the detection of whether or not a substrate has been held properly. If the above-described conventional techniques are combined, it becomes necessary to include a plurality of sensors. Thus, there arises a problem in that the circuit configuration of the sensors becomes complex.

The present invention has been made to solve the above-described problems. An object of the present invention is to provide an end effector included in a substrate conveying robot, the end effector being capable of performing, with a simple configuration, the detection of the presence or absence of a substrate in a cassette and the detection of whether or not a substrate has been held properly.

Solution to Problem

In order to solve the above-described problems, an end effector according to one aspect of the present invention includes: a hand; a holder provided on the hand and configured to hold a first substrate; a mapping detector provided at a distal end portion of the hand, the mapping detector being configured to face a second substrate stored in a cassette and detect presence or absence of the second substrate; a light emitter, which the hand is provided with and which is configured to convert an electrical input to generate detection light; a light receiver, which the hand is provided with and which is configured to receive the detection light and convert the detection light into an electrical output; and an optical path formed in the hand, through which the detection light emitted from the light emitter passes to be incident on the light receiver. The optical path is formed such that the detection light is blocked by the first substrate held by the holder, and such that the detection light is blocked by the second substrate detected by the mapping detector.

According to the above configuration, depending on whether or not the detection light travelling through the optical path has been blocked, the electrical output changes in accordance with a change in a received light amount detected by the light receiver. A substrate holding state detection operation of detecting the holding state of the first substrate and a mapping detection operation of detecting the presence or absence of the second substrate stored in the cassette are not performed at the same time. Therefore, in each of the substrate holding state detection operation and the mapping detection operation, the electrical output changing in accordance with the received light amount detected by the light receiver is monitored, which makes it possible to detect whether or not the first substrate in a normal condition is set properly and detect the mapping of the second substrate stored in the cassette. Since these two types of detections can be performed by means of one set of the light emitter and the light receiver, the configuration for the detections can be simplified.

Specifically, in the substrate holding state detection operation, if the light is blocked when a substrate has been retrieved and held by the hand, the current state is determined to be a state where a substrate in a normal condition is set properly. On the other hand, if the light passes through, the current state can be determined to be one of the following states: a state where no substrate is present; a state where a substrate in an abnormal condition is set; and a state where a substrate in a normal condition is set improperly.

The optical path may include: a first section formed such that if the first substrate is in a normal condition and is set on the holder properly, the detection light is blocked by the first substrate, and otherwise, the detection light is not blocked in the first section; and a second section formed such that if there is the second substrate stored in the cassette, the detection light is blocked by an outer peripheral portion of the second substrate, and otherwise, the detection light is not blocked in the second section.

The first section and the second section may be provided in series.

The light emitter and the light receiver may include a light-emitting element and a light-receiving element, respectively, and the light-emitting element and the light-receiving element may form a transmissive optical sensor.

Advantageous Effects of Invention

The present invention has an advantage of being able to provide an end effector included in a substrate conveying robot, the end effector making it possible to realize, with a simple configuration, both the detection of the presence or absence of a substrate in a cassette and the detection of whether or not a substrate has been held properly.

The above object, other objects, features, and advantages of the present invention will be made clear by the following detailed description of a preferred embodiment with reference to the accompanying drawings.

DESCRIPTION OF EMBODIMENTS

Hereinafter, one embodiment of the present invention is described with reference to the drawings.

Figure 1:
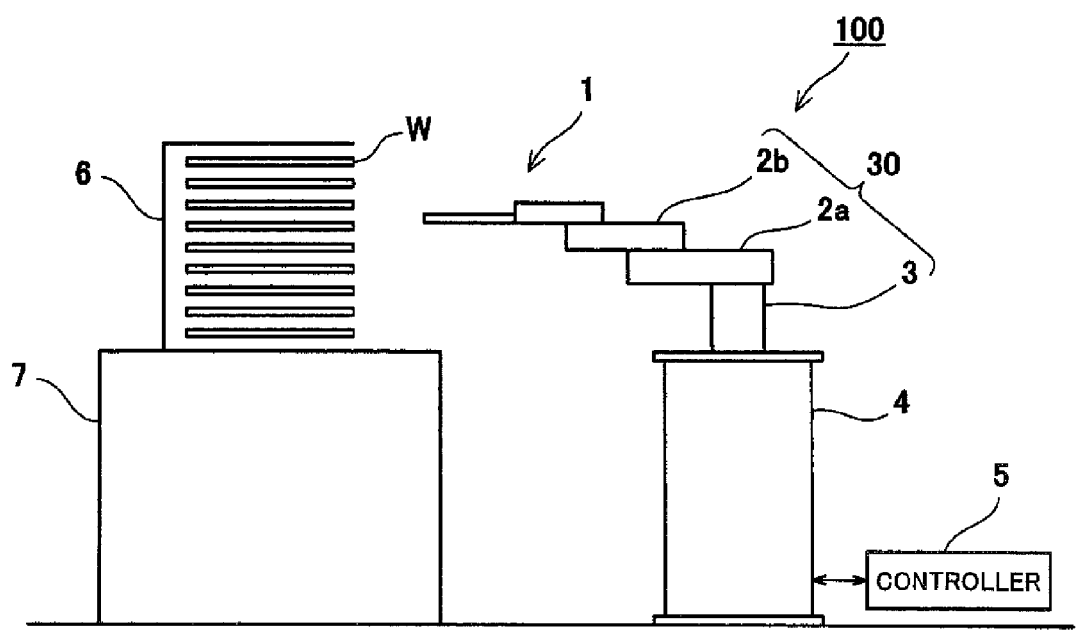
FIG. 1 is a side view of a substrate conveying robot including an end effector according to one embodiment of the present invention.

FIG. 1 is a side view of a substrate conveying robot 100 including an end effector 1 according to one embodiment of the present invention. As shown in FIG. 1, the substrate conveying robot 100 is installed, for example, in a semiconductor processing facility for manufacturing semiconductor elements. In the semiconductor processing facility, the substrate conveying robot 100 is utilized for conveying a substrate W, such as a wafer, which is a material of a semiconductor element. Examples of the wafer include a semiconductor wafer and a glass wafer. Examples of the semiconductor wafer include a silicon wafer, a wafer made of a single semiconducting material different from silicon, and a wafer made of a compound semiconducting material. Examples of the glass wafer include a glass substrate for use in FPD, a glass substrate for use in MEMS, and a sapphire (single crystal alumina) wafer. A plurality of treatment devices are installed in the semiconductor processing facility. For example, the treatment devices are devices for subjecting the wafer to heat treatment, impurity introducing treatment, thin film forming treatment, lithography treatment, cleaning treatment, and flattening treatment. The substrate conveying robot 100 conveys the substrate W to an area (a treatment chamber) in which these treatment devices are disposed. In the present embodiment, substrates W are stored on respective shelves in a multi-staged manner in a cassette 6 mounted on a cassette stand 7.

<Substrate Conveying Robot>

For example, the substrate conveying robot 100 includes: the end effector 1; an arm 2 including a first arm 2a and a second arm 2b; a lifting/lowering shaft 3; a base 4; and a controller 5. In the present embodiment, the substrate W is placed on the end effector 1 of a horizontal articulated four-axis robot.

The substrate conveying robot 100 includes the base 4, which is fixed to a suitable position (e.g., a floor) in the semiconductor processing facility. The lifting/lowering shaft 3 is provided on the base 4. On the base 4, the axis of the lifting/lowering shaft 3 extends vertically, for example. The base 4 includes a built-in lifting/lowering actuator (not shown), which is an air cylinder, for example. When the actuator operates, the lifting/lowering shaft 3 on the top surface of the base 4 is lifted or lowered vertically.

The elongated first arm 2a is provided on the upper end of the lifting/lowering shaft 3. The first arm 2a extends horizontally from the upper end of the lifting/lowering shaft 3. One end of the first arm 2a is connected to the lifting/lowering shaft 3 such that the first arm 2a is swingable about a vertical axis. The lifting/lowering shaft 3 includes a built-in swing actuator (not shown), which is an electric motor, for example. When the actuator operates, the first arm 2a swings in a horizontal plane relative to the lifting/lowering shaft 3.

The elongated second arm 2b is provided on the upper surface side of the other end of the first arm 2a. The second arm 2b extends horizontally from the other end of the first arm 2a. One end of the second arm 2b is connected to the first arm 2a such that the second arm 2b is swingable about a vertical axis. The other end of the first arm 2a includes a built-in swing actuator (not shown), which is an electric motor, for example. When the actuator operates, the second arm 2b swings in a horizontal plane relative to the other end of the first arm 2a.

The end effector 1, which is configured to hold a substrate W placed thereon, is provided on the upper surface side of the other end of the second arm 2b. The end effector 1 is connected to the other end of the second arm 2b such that the end effector 1 is swingable about a vertical axis. The other end of the second arm 2b includes a built-in swing actuator (not shown), which is an electric motor, for example. When the actuator operates, the end effector 1 swings in a horizontal plane relative to the other end of the second arm 2b.

For example, either in accordance with an input from an operating device (not shown) or automatically, the controller 5 controls the operation of each of the actuators that drive the lifting/lowering shaft 3, the first arm 2a, the second arm 2b, and the end effector 1, such that the end effector 1 moves vertically and horizontally. By suitably controlling the operation speed of each actuator, the end effector 1 can be caused to move along an intended path in a horizontal plane. In the substrate conveying robot 100, the lifting/lowering shaft 3, the first arm 2a, the second arm 2b, and the actuators driving the respective devices form a drive unit 30 for causing the end effector 1 to move.

<End Effector>

Figure 2:
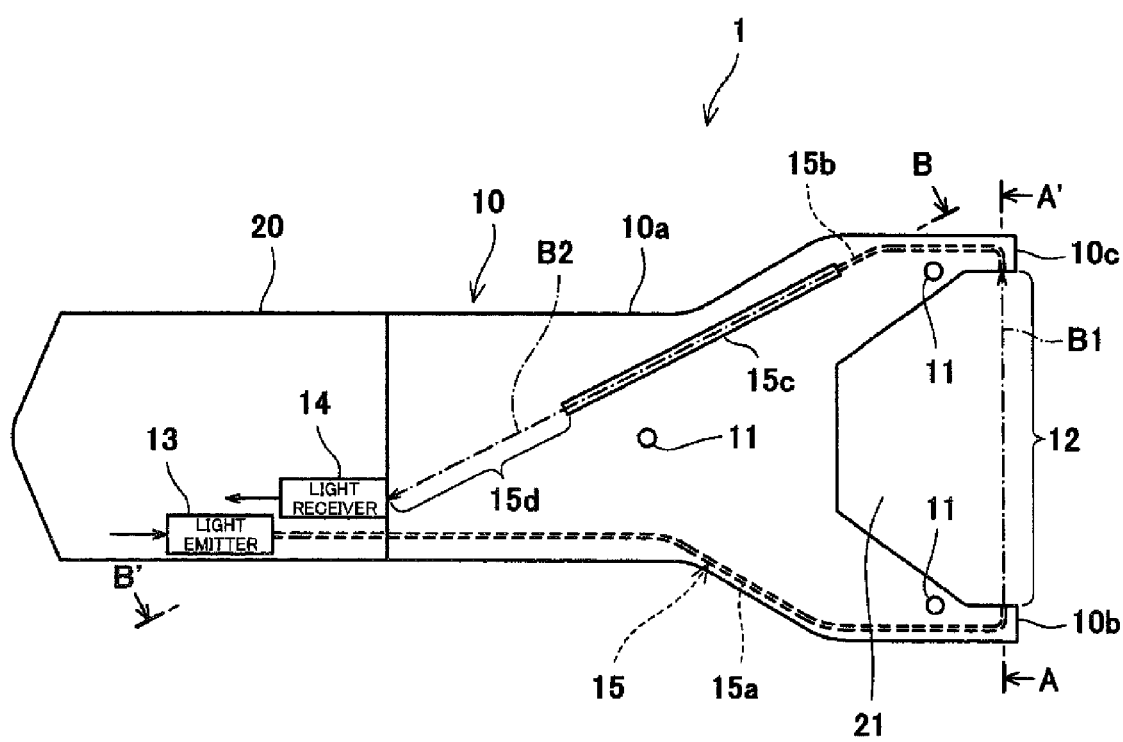
FIG. 2 is a plan view of the end effector of FIG. 1 seen from above.

FIG. 2 is a plan view of the end effector 1 of FIG. 1 seen from above. As shown in FIG. 2, the end effector 1 includes: a hand 10; substrate holders 11 formed on the hand 10; a mapping detector 12, which is formed in an area extending from distal end portions 10b and 10c of the hand 10 across notch space 21, the mapping detector 12 being configured to face a substrate W stored in the cassette 6 and detect the presence or absence of the substrate W; a light emitter 13 provided in the hand 10 and configured to convert an electrical input from the controller 5 to generate detection light; a light receiver 14 provided on the hand 10 and configured to receive the detection light and convert the detection light into an electrical output to the controller 5; and an optical path 15 formed in the hand 10, through which the detection light emitted from the light emitter 13 passes to be incident on the light receiver 14.

The structure of the hand 10 is not particularly limited. In the present embodiment, the hand 10 is formed by using, for example, a plate material that is Y-shaped when seen in plan view. The Y-shaped body includes a single proximal end portion 10a and a pair of distal end portions 10b and 10c. The distal end portions 10b and 10c extend from the proximal end portion as two portions branching off from the proximal end portion. The notch space 21 is formed between the pair of distal end portions 10b and 10c. The proximal end portion 10a of the hand is fixed to one end of an attachment plate 20, and the body of the hand 10 extends horizontally from the attachment plate 20. The other end of the attachment plate 20 is swingably connected to the other end of the second arm 2b.

The hand 10 is configured to hold a discoid substrate W placed thereon. Three substrate holders 11 for holding the substrate W are formed on the upper surfaces of the proximal end portion 10a and the distal end portions 10b and 10c of the hand. In the present embodiment, for example, the substrate holders 11 are configured to be controlled to reduce pressure at portions that come into contact with the substrate W, and thereby the substrate W is sucked and held by these portions. In this manner, the substrate W is held by the substrate holders 11.

The optical path 15 includes: light guiding sections, in which the detection light is guided by light guiding members; and sections in which the detection light travels through space. In the present embodiment, optical fibers 15a and 15b are used as the light guiding members.

One end of the optical fiber 15a is connected to the light emitter 13, which is built-in in the attachment plate 20 of the hand 10. The optical fiber 15a is laid to extend from the back side of the proximal end portion 10a of the hand to the back side of the distal end portion 10b of the hand. The optical fiber 15a guides the detection light emitted from the light emitter 13 to the back side of the distal end portion 10b of the hand.

One end of the optical fiber 15b is connected to the back side of the distal end portion 10c of the hand. The optical fiber 15b is laid to extend to one end of a rectangular slit 15c formed in the proximal end portion 10a of the hand (i.e., the end of the slit 15c at the distal end side of the hand 10). The optical fiber 15b guides the detection light that is incident on the back side of the distal end portion 10c of the hand to the slit 15c. It should be noted that a light-converging element (e.g., a convex lens) and a light-diverging element (e.g., a concave lens), which are not shown, may be disposed as necessary on both sides of each of the optical fibers 15a and 15b.

The sections in which the detection light travels through space include a first section and a second section. The first section serves as the mapping detector 12, in which the detection light travels through the notch space 21 between the distal end portion 10b of the hand and the distal end portion 10c of the hand. In the second section, the detection light travels through the slit 15c of the proximal end portion 10a of the hand and space 15d over the proximal end portion 10a of the hand.

Figure 3:
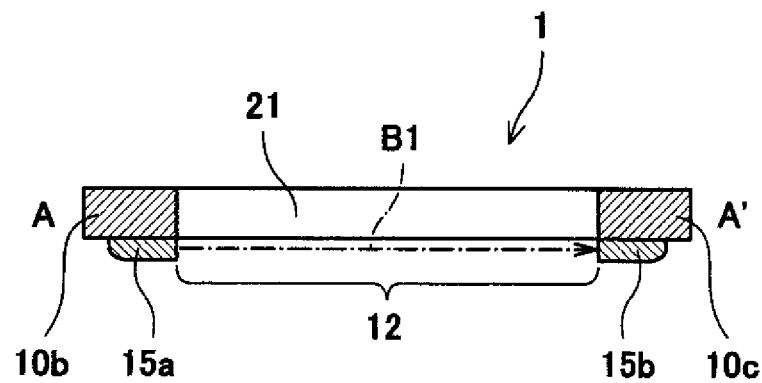
FIG. 3 is a sectional view of distal end portions of a hand of the end effector of FIG. 2, taken along line A-A' of FIG. 2.

FIG. 3 is a sectional view of the distal end portions 10b and 10c of the hand of the end effector 1 of FIG. 2, taken along line A-A' of FIG. 2. As shown in FIG. 3, detection light B1 (indicated by a one-dot chain line arrow) emitted from an end of the optical fiber 15a at the back side of the distal end portion 10b of the hand travels through the mapping detector 12 (i.e., the first section) between the distal end portion 10b and the distal end portion 10c of the hand, and is then incident on an end of the optical fiber 15c at the back side of the distal end portion 10c of the hand.

Figure 4:
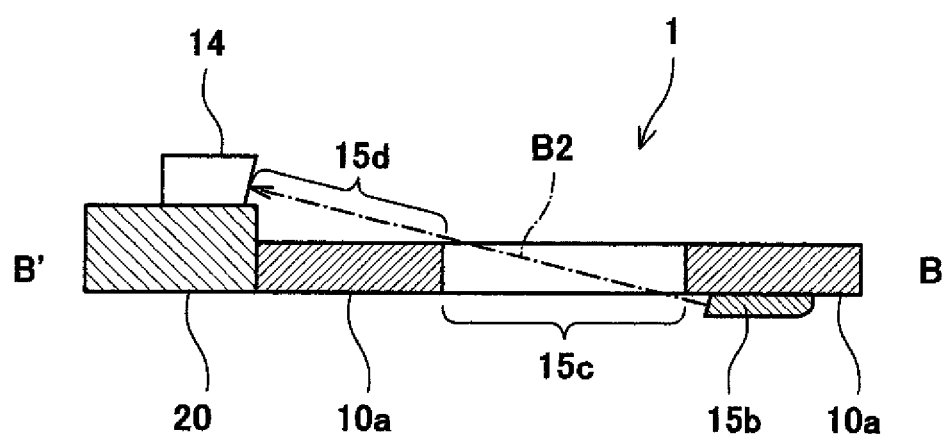
FIG. 4 is a sectional view of the hand of the end effector of FIG. 2, taken along line B-B' of FIG. 2.

FIG. 4 is a sectional view of the proximal end portion 10a of the hand of the end effector 1 of FIG. 2, taken along line B-W of FIG. 2. As shown in FIG. 4, detection light B2 (indicated by a one-dot chain line arrow) emitted from an end of the optical fiber 15b at the back side of the proximal end portion 10a of the hand travels through the slit 15c formed in the proximal end portion 10a of the hand 10 and the space 15d over the proximal end portion 10a of the hand 10 (i.e., the second section), and is then received by the light receiver 14 provided on the attachment plate 20 of the hand 10.

As described above, the first section and the second section are provided on the optical path 15 in series. The detection light emitted from the light emitter 13 passes through the optical path 15, and is then incident on the light receiver 14. That is, a single optical path is formed from the light emitter 13 through the optical path 15 to the light receiver 14.

<Control System>

Figure 5:
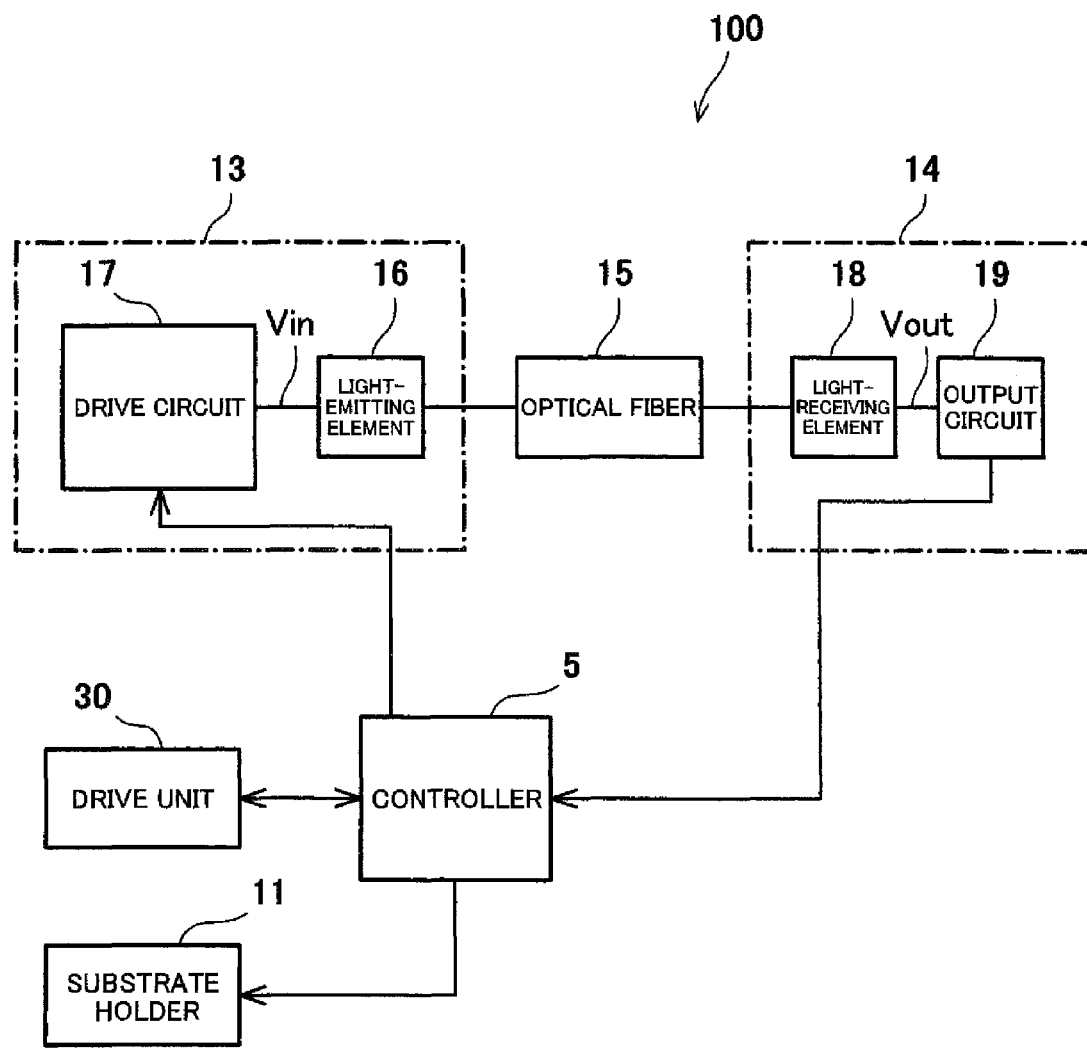
FIG. 5 is a block diagram showing a control system in the substrate conveying robot of FIG. 1.

FIG. 5 is a block diagram showing a control system in the substrate conveying robot 100. As shown in FIG. 5, the controller 5 of the substrate conveying robot 100 mainly controls: the light emitter 13 configured to convert an electrical input from the controller 5 to generate detection light; a light receiver 14 configured to receive the detection light from the light emitter 13 via the optical path 15 including the optical fibers and space, and convert the received detection light into an electrical output to the controller 5; the drive unit 30 for causing the end effector 1 to move; and the substrate holders 31 of the end effector 1.

In accordance with a control command from the controller 5, the drive unit 30 operates the actuators that drive the lifting/lowering shaft 3, the first arm 2a, and the second arm 2b, which are shown in FIG. 1, thereby causing the end effector 1 to move vertically and horizontally.

In accordance with a control command from the controller 5, the substrate holders 11 control pressure at portions that come into contact with a substrate W, and thereby the substrate W is sucked and held by these portions. In this manner, the substrate W is held by the substrate holders 11.

The light emitter 13 includes: a light-emitting element 16 configured to generate and emit detection light; and a drive circuit 17 configured to apply a voltage Vin to the light-emitting element 16 to drive the light-emitting element 16.

In the present embodiment, for example, a light-emitting diode or a laser diode is used as the light-emitting element 16. The drive circuit 17 generates the voltage Vin in accordance with a control signal (an electrical input) from the controller 5, and drives the light-emitting element 16 with the voltage Vin.

The light receiver 14 includes: a light-receiving element 18 configured to convert an optical signal into an electrical signal in such a manner that the light-receiving element 18 generates a voltage Vout in accordance with a received light amount when the light-receiving element 18 has received the detection light; and an output circuit 19 configured to amplify the electrical signal and outputs the amplified signal as a detection signal (an electrical output). In the present embodiment, for example, a photodiode is used as the light-receiving element 18. The output circuit 19 outputs the detection signal to the controller 5.

Each of the optical fibers forming the optical path 15 is connected to the light-emitting element 16 or the light-receiving element 18 via a connector, which is not shown. Thus, in the present embodiment, the light emitter 13 and the light receiver 14 include the light-emitting element 16 and the light-receiving element 18, respectively, and the light-emitting element 16 and the light-receiving element 18 form a transmissive optical sensor.

<Operation>

Next, one example of a mapping detection operation of the end effector 1 is described. As one example, assume here that, in the mapping detection operation, the substrate conveying robot 100 causes the end effector 1 to sequentially scan the shelves from the uppermost shelf to the lowermost shelf to detect the presence or absence of a substrate on each shelf.

Figure 6:
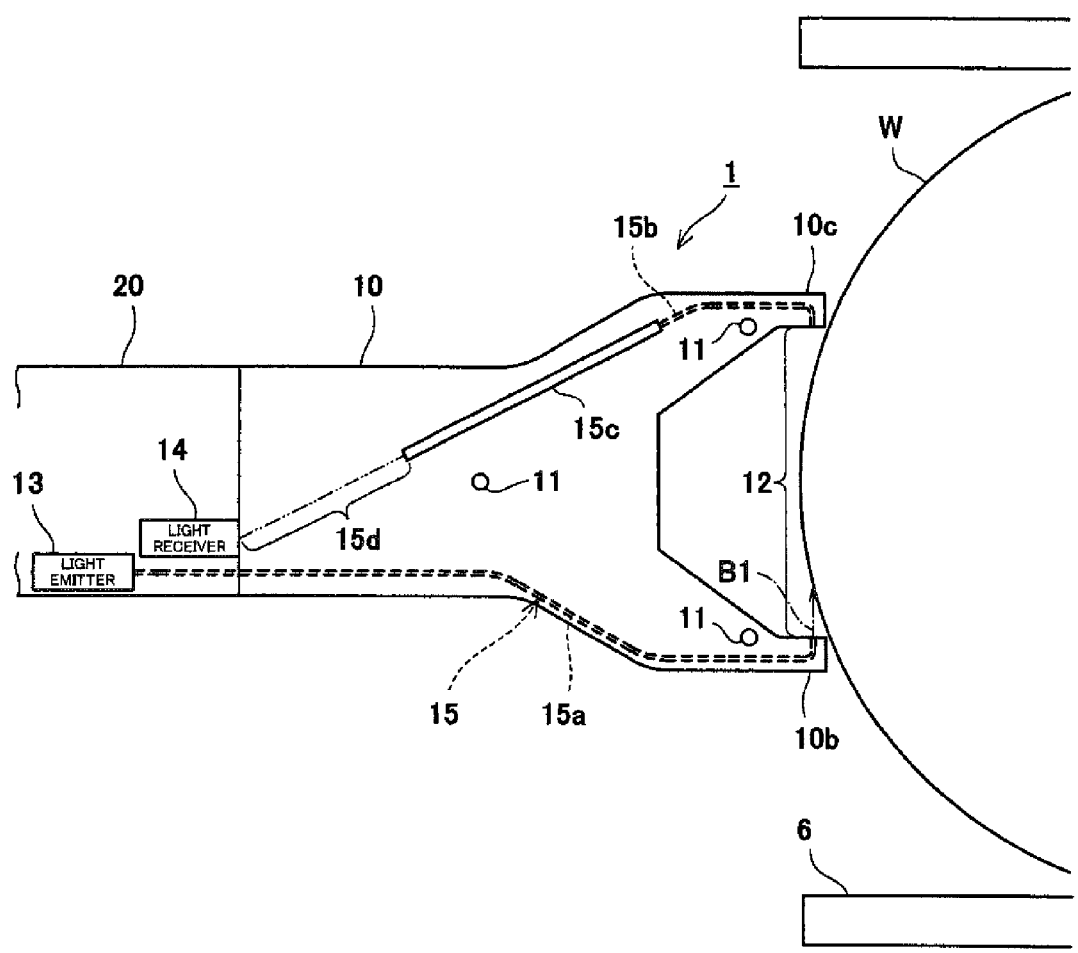
FIG. 6 is a plan view showing a mapping detection operation of the end effector.

FIG. 6 is a plan view showing the mapping detection operation of the end effector 1. As shown in FIG. 6, the scanning is performed, for example, in such a manner that the mapping detector 12 of the end effector 1 is caused to face a substrate W stored on the n-th shelf in the cassette 6. At the time, when the detection light B1 (indicated by a one-dot chain line arrow) emitted from the end of the optical fiber 15a at the back side of the distal end portion 10b of the hand travels through the mapping detector 12 (the first section) between the distal end portion 10b and the distal end portion 10c of the hand, if there is the substrate W stored in the cassette 6, the detection light B1 is blocked by the outer peripheral portion of the substrate W. As a result, the detection light B1 is not received by the end of the optical fiber 15c at the back side of the distal end portion 10c of the hand. That is, on the optical path 15, the detection light B1 is blocked by the substrate W detected by the mapping detector 12.

As described above, the mapping detector 12 (the first section) is formed such that if there is the substrate W stored in the cassette 6, the detection light B1 is blocked by the outer peripheral portion of the substrate W, and otherwise, the detection light B1 is not blocked.

Next, one example of a substrate holding detection operation of the end effector 1 is described. For example, if the substrate W is detected on the n-th shelf in the cassette 6 in the above-described mapping detection operation, then the substrate conveying robot 100 inserts the end effector 1, which is holding no substrate, into the cassette 6 at the position of the n-th shelf, such that the substrate W stored on the n-th shelf is placed onto the substrate holders 11 of the hand 10. After detecting whether or not the substrate W is properly set on the substrate holders 11, the substrate conveying robot 100 causes the end effector 1 to retract from the cassette 6. In this manner, the retrieving and holding of the substrate W are performed.

Figure 7A:
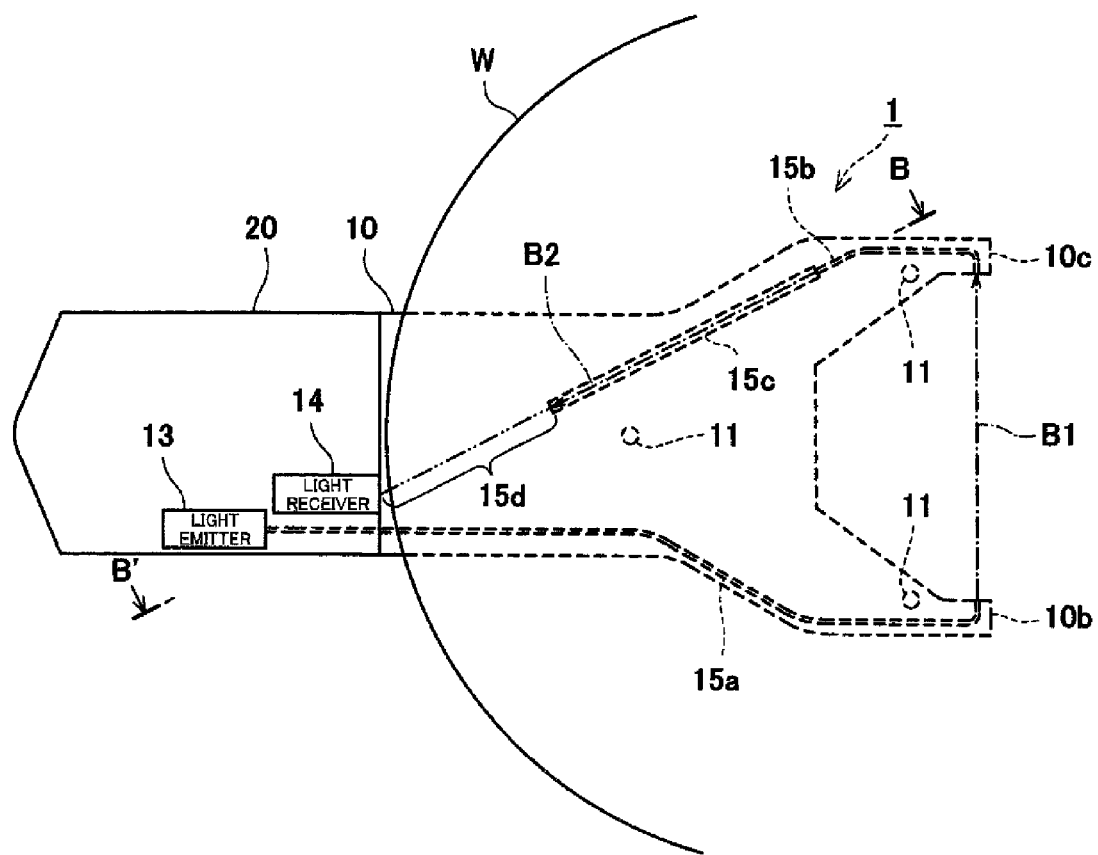
FIG. 7A and FIG. 7B are a plan view and a sectional view showing a substrate holding detection operation in a case where a substrate is held by the end effector properly.
Figure 7B:
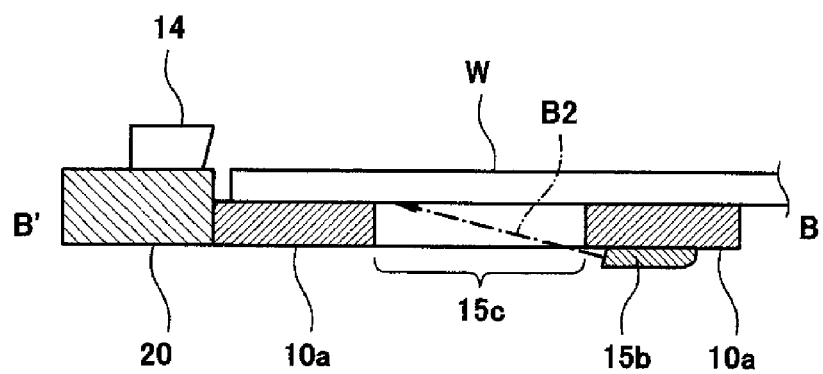

FIG. 7A and FIG. 7B are a plan view and a sectional view showing the substrate holding detection operation in a case where a substrate is held by the end effector 1 properly. As shown in FIG. 7A and FIG. 7B, the optical path 15 is formed such that the detection light B2 (indicated by a one-dot chain line arrow) is blocked by the substrate W held by the substrate holders 11. In a case where the substrate W is in a normal condition and is properly set on the substrate holders 11, the detection light B2 is blocked by the substrate W. In this case, the current state is determined to be a state where a substrate in a normal condition is set properly.

The optical path 15 is formed such that the detection light B2 is not blocked if the substrate is set improperly.

Figure 8A:
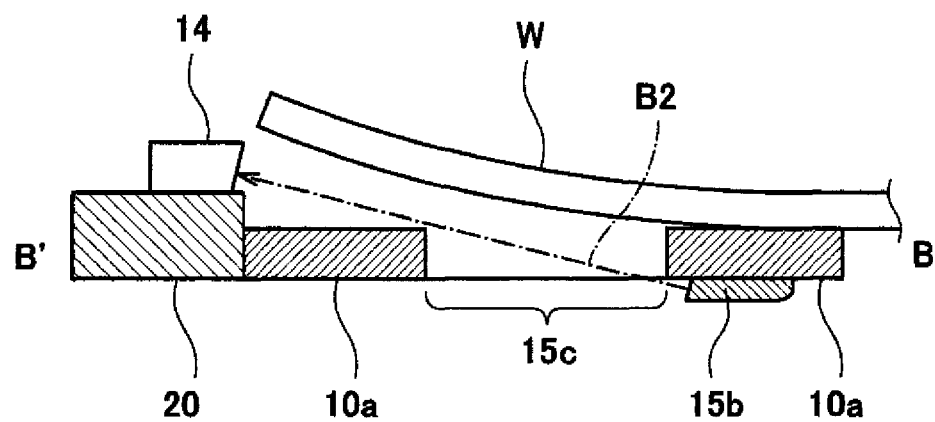
FIG. 8A and FIG. 8B are sectional views showing the substrate holding detection operation in a case where a substrate is held by the end effector improperly.
Figure 8B:
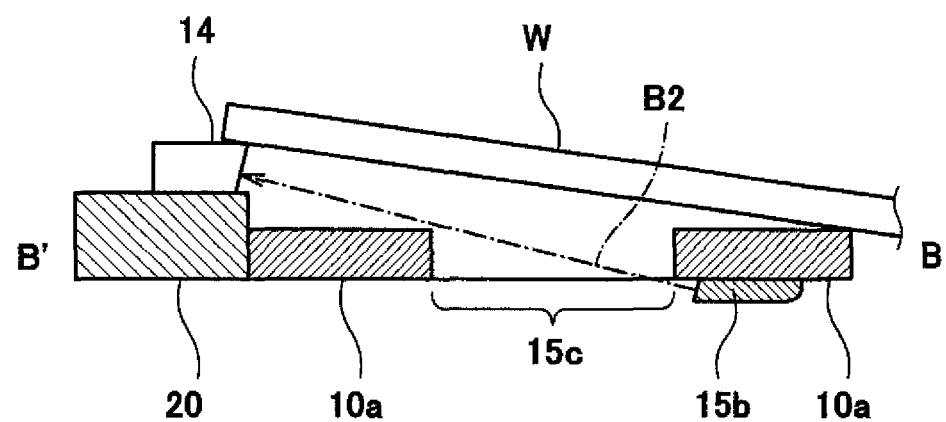

FIG. 8A and FIG. 8B are sectional views showing the substrate holding detection operation in a case where a substrate is held by the end effector 1 improperly.

FIG. 8A shows a state where the substrate W is bent. In such a case where the substrate in an abnormal condition is set, the detection light B2 from the optical fiber 15b reaches the light receiver 14.

FIG. 8B shows a state where the substrate W is placed not on the substrate holders 11 but on the light receiver 14. In such a case where the substrate in a normal condition is set improperly, the detection light B2 from the optical fiber 15b reaches the light receiver 14. That is, in a case where the detection light B2 passes through, the current state can be determined to be one of the following states: a state where no substrate is present; a state where a substrate in an abnormal condition is set; and a state where a substrate in a normal condition is set improperly.

Figure 9:
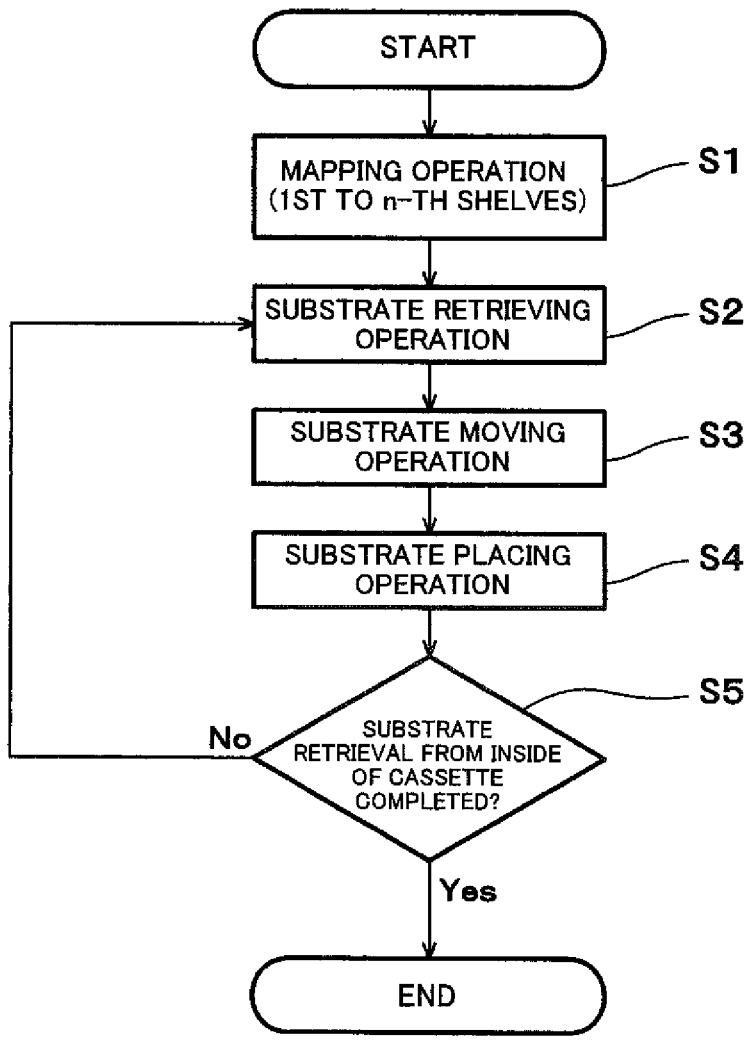
FIG. 9 is a flowchart showing one example of a control operation of the substrate conveying robot.

Hereinafter, one example of a control operation of the substrate conveying robot 100 is described with reference to a flowchart of FIG. 9. As shown in FIG. 9, first, the controller 5 controls a mapping operation of the end effector 1 (step 1). The substrate conveying robot 100 causes the end effector 1 to sequentially scan the first to n-th shelves in the cassette 6 to detect whether or not a substrate is stored on each of the shelves.

Next, the controller 5 controls a substrate retrieving operation of the substrate conveying robot 100 (step 2). In accordance with mapping detection results, the substrate conveying robot 100 causes the arm 2 to move to a shelf on which a substrate is stored (e.g., the first shelf), and retrieves the substrate from the shelf by the end effector 1. Then, the controller 5 controls a substrate moving operation of the substrate conveying robot 100 (step 3). The substrate conveying robot 100 causes the arm 2 to move with the substrate held by the substrate holders 11 of the end effector 1.

Next, after causing the arm 2 of the substrate conveying robot 100 to move to a predetermined position, the controller 5 controls a substrate placing operation of the substrate conveying robot 100 (step 4). In this operation, the holding of the substrate by the substrate holders 11 of the end effector 1 is released, and the substrate is placed on the predetermined position.

Then, the controller 5 repeats the substrate retrieving operation until the retrieval of all the substrates from the inside of the cassette 6 by the substrate conveying robot 100 is completed, and ends the control when the retrieval of all the substrates from the inside of the cassette 6 is completed (step 5).

In the above-described flowchart, mapping detection by the end effector 1 is performed in step 1, and substrate holding detection by the end effector 1 is performed in step 2 to step 4.

Figure 10:
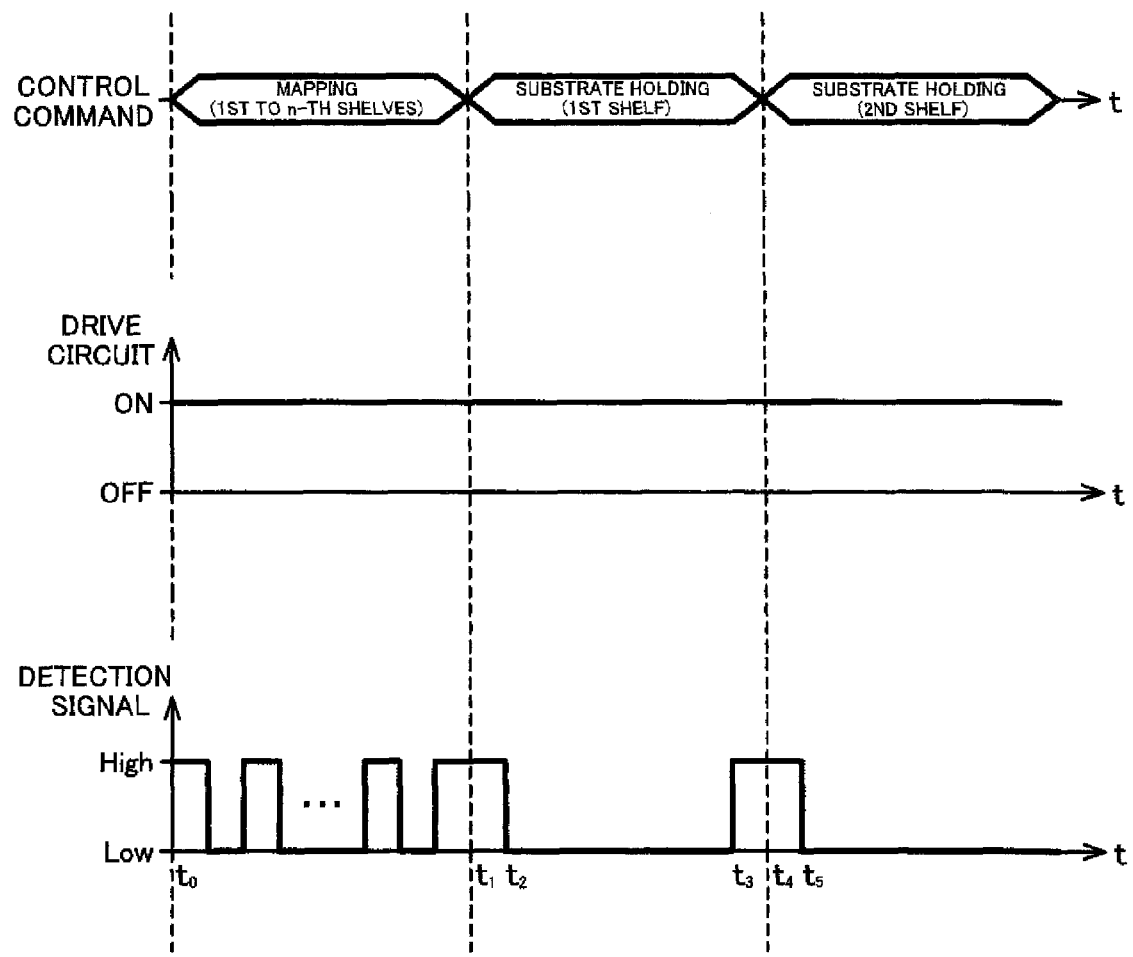
FIG. 10 is a waveform chart showing input/output waveforms at the time of mapping detection and substrate holding detection by the end effector in the control operation shown in FIG. 9.

Next, FIG. 10 is a waveform chart showing input/output waveforms at the time of mapping detection and substrate holding detection by the end effector 1 in the control operation shown in FIG. 9.

The upper waveform chart in FIG. 10 shows control commands from the controller 5 to the drive unit 30 and the substrate holders 11. The middle waveform chart in FIG. 10 shows the control signal inputted from the controller 5 to the drive circuit 17 of the light emitter 13. If the level of the control signal is High, the drive circuit 17 applies a voltage Vin to the light-emitting element 16 of the light emitter 13 to cause the light-emitting element 16 to emit light.

The lower waveform chart in FIG. 10 shows waveforms of the detection signal outputted from the light receiver 14 to the controller 5. Depending on whether or not the detection light travelling through the optical path 15 has been blocked, the level of the detection signal (i.e., an electrical output) changes in accordance with a change in a received light amount detected by the light receiver 14.

From a time t0 to a time t1, the controller 5 controls the mapping operation of the end effector 1. In accordance with a control command from the controller 5 to the drive unit 30, the operation of the substrate conveying robot 100 shifts to an operation of mapping the substrates W stored on the first to n-th shelves in the cassette 6. First, at the time 0, the controller 5 transmits a control signal of a High level (i.e., ON) to the light emitter 13 in synchronization with the control command to the drive unit 30. Accordingly, the light-emitting element 16 emits light, and the level of the detection signal becomes High.

During the period from the time t0 to the time t1, a substrate W is detected in the cassette 6 when the detection light B1 is blocked. As a result, the level of the detection signal decreases from High to Low. The lower chart in FIG. 10 shows a case where substrates are stored on all of the first to n-th shelves. In this case, the detection light B1 is blocked n times corresponding to the number (n) of substrates stored in the cassette 6. Accordingly, during the period from the time t0 to the time t1, the level of the detection signal decreases from High to Low n times. In this manner, the mapping detection by the end effector 1 is performed.

At the time t1, the controller 5 controls the substrate retrieving operation of the substrate conveying robot 100. In accordance with a control command from the controller 5 to the substrate holders 11, the operation of the substrate conveying robot 100 shifts to an operation of retrieving the substrate W detected on the first shelf in the cassette 6. Also at the time, the controller 5 continues transmitting a control signal of a High level (i.e., ON) to the light emitter 13 in synchronization with the control command to the substrate holders 11. Here, the level of the detection signal continues to be High.

At a time t2, in accordance with the control command from the controller 5 to the substrate holders 11, the substrate conveying robot 100 holds the retrieved substrate W. If the substrate W is held properly, the level of the detection signal changes from High to Low.

During the period from the time t2 to a time t3, the controller 5 controls the substrate moving operation of the substrate conveying robot 100. The substrate conveying robot 100 causes the arm 2 to move with the substrate held by the substrate holders 11 of the end effector 1. At the time, if the substrate W is in a state of being held properly, the level of the detection signal remains Low.

At the time t3, after causing the arm 2 of the substrate conveying robot 100 to move to a predetermined position, the controller 5 controls the substrate placing operation of the substrate conveying robot 100. In this operation, the holding of the substrate by the substrate holders 11 of the end effector 1 is released, and the substrate is placed on the predetermined position. At the time, the substrate W blocking the space of the mapping detector 12 at the distal end of the hand is eliminated. As a result, the level of the detection signal becomes High. In this manner, the substrate holding detection is performed during the operations of retrieving, moving, and placing the substrate.

At a time t4, in accordance with a control command from the controller 5 to the substrate holders 11, the operation of the substrate conveying robot 100 shifts to an operation of retrieving the substrate W detected on the second shelf in the cassette 6. Then, when the substrate W of the second shelf is held at a time t5, the detection light B1 is blocked. As a result, the level of the detection signal decreases from High to Low. Thus, also in the case of the substrates on the second and the following shelves, the substrate holding detection is performed in the same manner as in the case of the substrate on the first shelf.

According to the above-described configuration, the substrate holding state detection operation of detecting the holding state of the substrate W and the mapping detection operation of detecting the presence or absence of the substrate W stored in the cassette 6 are not performed at the same time.

Therefore, in the present embodiment, in each of the substrate holding state detection operation and the mapping detection operation, an electrical output (the detection signal) changing in accordance with a received light amount detected by the light receiver 14 is monitored, which makes it possible to detect whether or not the substrate W in a normal condition is set properly and detect the mapping of the substrate W stored in the cassette. Since these two types of detections can be performed by means of one set of the light emitter 13 and the light receiver 14, the configuration for the detections can be simplified.

It should be noted that the present embodiment adopts a technique of holding the substrate W by suction. In this technique, pressure is controlled at portions of the substrate holders 11, the portions coming into contact with the substrate W, and thereby the substrate W is sucked and held by the substrate holders 11. However, the manner of holding the substrate is not thus limited, and any configuration capable of holding the substrate may be adopted, so long as the hand is provided with the configuration.

From the foregoing description, numerous modifications and other embodiments of the present invention are obvious to one skilled in the art. Therefore, the foregoing description should be interpreted only as an example and is provided for the purpose of teaching the best mode for carrying out the present invention to one skilled in the art. The structural and/or functional details may be substantially altered without departing from the spirit of the present invention.

INDUSTRIAL APPLICABILITY

The present invention is applicable to an end effector of a substrate conveying robot for conveying a substrate such as a semiconductor wafer or a glass substrate.

REFERENCE SIGNS LIST 1 end effector
2a first arm 2b second arm
3 lifting/lowering shaft
4 base
5 controller
6 cassette
7 cassette stand
10 hand
10a proximal end portion of the hand
10b, 10c distal end portion of the hand
11 substrate holder
12 mapping detector (first section)
13 light emitter
14 light receiver
15 optical path
15a, 15b optical fiber
15c slit
15d second section
16 light-emitting element
17 drive circuit
18 light-receiving element
19 output circuit
20 attachment plate
21 notch space
30 drive unit
31 substrate holder
100 substrate conveying robot

The invention claimed is:

1. An end effector comprising:
a hand;
a holder provided on the hand and configured to hold a first substrate;
a mapping detector provided at a distal end portion of the hand, the mapping detector being configured to face a second substrate stored in a cassette and detect presence or absence of the second substrate;
a light emitter, which the hand is provided with and which is configured to convert an electrical input to generate detection light;
a light receiver, which the hand is provided with and which is configured to receive the detection light and convert the detection light into an electrical output; and
an optical path formed in the hand, through which the detection light emitted from the light emitter passes to be incident on the light receiver, wherein
the optical path is formed such that a first section of the optical path, in which the second substrate detected by the mapping detector blocks the detection light, and a second section of the optical path, in which the detection light is blocked by the first substrate held by the holder, do not overlap each other, and
the first section and the second section are provided in series such that the first and second sections form one continuous optical path.

2. The end effector according to claim 1, wherein
the first section is formed such that if there is the second substrate stored in the cassette, the detection is blocked by an outer peripheral portion of the second substrate, and otherwise, the detection light is not blocked in the first section, and
the second section is formed such that if the first substrate is in a normal condition and is set on the holder properly, the detection light is blocked by the first substrate, and otherwise, the detection light is not blocked in the second section.

3. The end effector according to claim 2, wherein
the light emitter and the light receiver include a light-emitting element and a light-receiving element, respectively, and
the light-emitting element and the light-receiving element form a transmissive optical sensor.

4. The end effector according to claim 1, wherein
the light emitter and the light receiver include a light-emitting element and a light-receiving element, respectively, and
the light-emitting element and the light-receiving element form a transmissive optical sensor.

* * * * *